(12) United States Patent  
Wang et al.

(10) Patent No.: US 7,538,029 B2
(45) Date of Patent: May 26, 2009

(54) METHOD OF ROOM TEMPERATURE GROWTH OF SIO$_x$ ON SILICIDE AS AN ETCH STOP LAYER FOR METAL CONTACT OPEN OF SEMICONDUCTOR DEVICES

(75) Inventors: Yun-Yu Wang, Poughquag, NY (US); Christian Lavoie, Ossining, NY (US); Kevin E. Mello, Fishkill, NY (US); Conal E. Murray, Yorktown Heights, NY (US); Matthew W. Oonk, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 288 days.

(21) Appl. No.: 11/160,699

(22) Filed: Jul. 6, 2005

(65) Prior Publication Data

US 2007/0010093 A1    Jan. 11, 2007

(51) Int. Cl.
*H01L 21/44* (2006.01)
(52) U.S. Cl. .................. 438/655; 438/675; 438/637; 257/E21.593
(58) Field of Classification Search .................. 438/655
See application file for complete search history.

(56) References Cited

U.S. PATENT DOCUMENTS

| 5,912,188 | A | * | 6/1999 | Gardner et al. .............. 438/740 |
| 5,913,139 | A | * | 6/1999 | Hashimoto et al. .......... 438/618 |
| 6,114,734 | A | * | 9/2000 | Eklund ........................ 257/410 |
| 6,144,097 | A | * | 11/2000 | Asahina et al. ............. 257/751 |
| 6,211,083 | B1 | * | 4/2001 | Yang et al. ................... 438/682 |
| 6,287,951 | B1 | * | 9/2001 | Lucas et al. ................. 438/618 |
| 6,436,841 | B1 | * | 8/2002 | Tsai et al. .................... 438/738 |
| 6,500,728 | B1 | * | 12/2002 | Wang ......................... 438/424 |
| 6,551,901 | B1 | * | 4/2003 | Gu et al. ..................... 438/424 |
| 2001/0019898 | A1 | * | 9/2001 | Arafa et al. ................. 438/740 |
| 2002/0068429 | A1 | * | 6/2002 | Trivedi ........................ 438/618 |
| 2004/0067635 | A1 | * | 4/2004 | Wu et al. ..................... 438/624 |
| 2004/0070036 | A1 | * | 4/2004 | Setton ......................... 257/410 |
| 2005/0064721 | A1 | * | 3/2005 | Tsai et al. .................... 438/740 |
| 2005/0110070 | A1 | * | 5/2005 | Omura ........................ 257/311 |
| 2005/0158986 | A1 | * | 7/2005 | Wu et al. ..................... 438/634 |
| 2006/0057844 | A1 | * | 3/2006 | Domenicucci et al. ...... 438/655 |

FOREIGN PATENT DOCUMENTS

JP         2000216383 A   *  8/2000

* cited by examiner

*Primary Examiner*—Marcos D. Pizarro
*Assistant Examiner*—Igwe U. Anya
(74) *Attorney, Agent, or Firm*—Yuanmin Cai; Howard Cohn

(57) ABSTRACT

Silicide is protected during MC RIE etch by first forming an oxide film over the silicide and, after performing MC RIE etch, etching the oxide film. The oxide film is formed from a film of alloyed metal-silicon (M-Si) on the layer of silicide, then wet etching the metal-silicon. An ozone plasma treatment process can be an option to densify the oxide film. The oxide film may be etched by oxide RIE or wet etch, using 500:1 DHF.

13 Claims, 2 Drawing Sheets

US 7,538,029 B2

METHOD OF ROOM TEMPERATURE GROWTH OF SIO$_x$ ON SILICIDE AS AN ETCH STOP LAYER FOR METAL CONTACT OPEN OF SEMICONDUCTOR DEVICES

BACKGROUND OF THE INVENTION

The invention relates to semiconductor device fabrication techniques and, more particularly, to techniques for etching through a dielectric layer to an underlying silicide layer.

Typically, source and drain regions in a modern MOSFET (Metal-Oxide-Semiconductor Field-Effect-Transistor) devices are formed with overlying silicide as the contact. Silicides are alloys of silicon and metals, and are used as contact materials in silicon device manufacturing. Exemplary silicides are cobalt silicide (CoSi$_2$), nickel Silicide (NiSi), titanium silicide (TiSi$_2$), tungsten silicide (WSi$_2$), tantalum silicide (TaSi$_2$), and platinum silicide (PtSi).

Silicides are commonly used as conductors and contact materials in silicon semiconductor technology due to their high conductivity, compatibility with silicon, and suitability to small-geometry semiconductor devices. The high conductivity (low resistivity) of source/drain silicide serves to minimize the contribution of parasitic resistance in the source drain region to the series resistance of MOSFET devices that employ it. The parasitic series resistance of silicide itself is often so small that its contribution to total series resistance is considered to be negligible and not a limiting factor to device performance.

In the MC (Metal Contact) RIE (Reactive Ion Etching) process, due to poor selectivity of nitride RIE and silicide, MC RIE is normally etched into silicide. In 90 nm technology for silicon on insulator (SOI), because of thin Si, sometimes the MC RIE punches through the silicide and touches the surface of Si which causes weak driving current problems or contact resistance problems.

It is well known that SiO$_2$ can be used to act as a good RIE stop for the nitride RIE. Normally, silicide is covered with nitride which has a poor selectivity between nitride RIE and silicide. In order to protect the silicide from nitride etch, a thin oxide layer between silicide and nitride as an etch stop is preferred. However, conventional SiO$_x$ deposition can cause the oxidation of silicide and it creates a resistance problem. In order to avoid the oxidation of silicide, a thin oxide layer on top of silicide is preferably applied at room temperature.

Reactive Ion Etching (RIE) is a variation of plasma etching in which, during etching, a semiconductor wafer is placed on a RF (radio frequency) powered electrode. The wafer takes on a potential which accelerates etching species extracted from the plasma toward the etched surface. The chemical etching reaction is preferentially taking place in the direction normal to the surface, i.e. etching is more anisotropic than in plasma etching but is less selective. Although RIE leaves the etched surface damaged, it is a very common etching mode in semiconductor manufacturing.

FIGS. 1A and 1B illustrate a process 100 of the prior art, for etching through a dielectric layer to an underlying silicide layer of a semiconductor device.

A layer 104 of single crystalline silicon is bonded on a semiconductor (single crystal silicon) substrate (wafer) 101 through buried oxide 102 (BOX). The layer 104 typically has a thickness of 500-700 Angstroms. This is a typical vendor-supplied SOI (Silicon On Insulator) wafer. The silicon substrate 101 is shown much thinner than in reality (i.e., not to scale), for illustrative clarity.

A layer 106 of silicide is formed atop the layer 104 of single crystalline silicon. The silicide layer 106 typically has a thickness of about 200-300 Angstroms, and is suitably formed by traditional salicidation process (deposit metal, heat, etch, heat again). An area 107 disposed on the side of layer 104 and 106 is shallow trench isolation (STI).

A layer 108 of nitride is used to cap the silicide layer 106. The nitride layer 108 typically has a thickness of about 500 Angstroms, and is suitably formed by Chemical Vapor Deposition (CVD). Silicon Nitride (Si$_3$N$_4$; often referred to simply as "nitride"; often abbreviated as "SiN") is a dielectric material which is commonly used to provide an excellent mask (barrier) against oxidation of silicide during the subsequent dielectric deposition 110 such as SiO$_x$ deposition at high temperature.

A layer 110 of dielectric material is formed over the nitride layer 108. The dielectric layer 110 typically has a thickness of about 5000 Angstroms, and is suitably formed by CVD.

Then, MC (Metal Contact) RIE is performed to open a via (contact hole) 112, through the layers 110 and 108, to the underlying silicide 106. (MC RIE in general refers to both the dielectric and nitride etch (one process). (The RIE chemistry changes during the contact etch.) The resulting structure is shown in FIG. 1B.

Finally, a thin layer (liner) of Ti/TiN (titanium nitride), not shown, is deposited in the contact hole 112, which is ultimately filled with a conductor such as tungsten (W).

As best viewed in FIG. 1B, during MC RIE, the underlying silicide layer 106 is compromised (thinned, etched). This becomes a problem when the silicide 106 is thin and the Ti/TiN liner would then land on top of the silicon 104 instead of on the silicide 106, and this can cause a contact resistance problem. In the extreme case, MC RIE with sputter clean can cause the bottom of the MC to penetrate into the silicon and touch the bottom of Si (or top of buried oxide surface).

A solution to this problem is simply to ensure that the silicide layer 106 is thick enough to withstand some etching during MC RIE. However, the downside of such an approach would be Si consummption and contact resistance problems. In bulk (non SOI) technology, the problem would be junction leakage.

SUMMARY OF THE INVENTION

It is an object of the invention to provide an improved technique for fabricating semiconductor devices having silicide contact areas under contact holes through dielectric.

According to the present invention, a chemical etching method is used to grow a thin layer of SiO$_2$ as an etch stop on top of silicide.

According to the invention, a room temperature oxide film is formed under the nitride cap and functions as an RIE selective layer etch stop. Room temperature oxide formation is suitably performed by an alloyed metal Si (M-Si) sputtering process with subsequent wet etch to remove metal and oxide the residual Si, thus forming a thin layer of SiOx on top of silicide as well as on top of STI region.

Silicon dioxide (SiO$_2$, often referred to simply as "oxide") is a common insulator in semiconductor device technology, particularly in silicon MOS/CMOS (Metal-Oxide-Semiconductor/Complementary MOS) where it is use as a gate oxide. High quality films may be obtained by thermal oxidation of silicon. Typically, in the composition of the M-Si, the Si is about 10%-30% by atomic number, preferably about 15%-25% by atomic number and most preferably about 20% by atomic number (or atomic percentage).

The present invention, providing an oxide film over the silicide, benefits from the fact that MC nitride RIE is more selective to oxide than silicide, therefore protecting the silicide.

According to the invention, a method of forming a semiconductor device having a layer of silicide and a contact opening extending through an overlying dielectric layer to the layer of silicide is disclosed. The method comprises the steps of: before etching the contact opening, forming an room temperature oxide film over the layer of silicide without oxidizing silicide; and after etching the contact opening, etching the oxide film to expose the underlying silicide.

The step of etching the oxide film may comprise performing oxide reactive ion etching (RIE) or using 500:1 DHF.

The step of forming the oxide film may comprise: first forming a film of alloyed metal-silicon (M-Si) on the layer of silicide; and then forming the oxide film by wet etching the metal-silicon. The metal M in the alloyed metal-silicon (M-Si) is selected from the group consisting of Ti, Ni, Co, or other transition metal.

An ozone plasma treatment process may be performed to densify the oxide.

According to the invention, a method of protecting silicide during MC RIE etch comprises: before performing MC RIE etch, forming an oxide film over the silicide; and after performing the MC nitride RIE etch stopping on top of thin oxide film, etching the oxide film. The oxide film may be RIE etched or wet etched.

According to the invention, a semiconductor device comprises: a layer of silicide; a layer of oxide over the silicide; and a layer of nitride over the layer of oxide. The device may be a FET having source and drain regions and a gate electrode, and the layer of silicide is over the source and drain regions and the gate electrode.

The invention can be applied generally to thin film processing for the fabrication of structures for microelectronics or other nanotechnologies.

The invention can be applied to any fabrication process where silicon dioxide is required above a metal silicide (and a contact hole must be made, such as by MC RIE, through the oxide).

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

DETAILED DESCRIPTION OF THE INVENTION

Figure 1A:
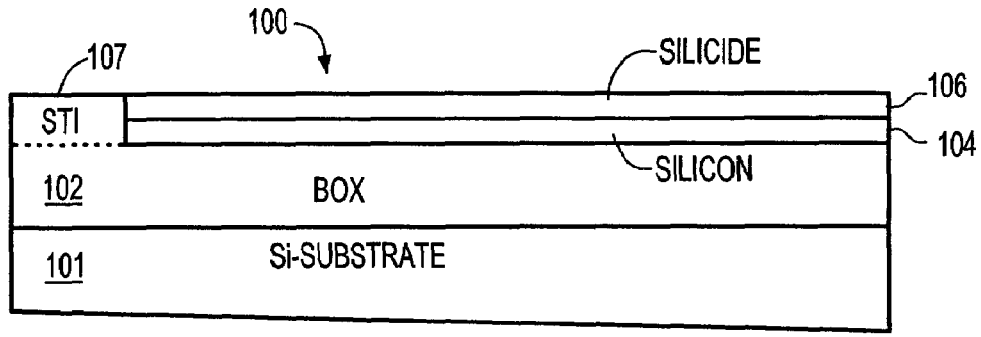
FIG. 1A is a cross-sectional view illustrating an initial step in an exemplary process for performing MC RIE, according to the prior art.

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) will be used to identify elements. If legends are provided, they are intended merely as an aid to the reader, and should not in any way be interpreted as limiting.

The invention relates to semiconductor device fabrication techniques and, more particularly, to techniques involving etching through a dielectric layer to an underlying silicide layer.

As discussed hereinabove, silicide and underlying silicon can be compromised during MC RIE.

FIGS. 2A-2D illustrate an exemplary embodiment 200 of the invention. An exemplary starting structure comprises a substrate (not shown, compare 101) with a layer 202 (compare 102) of buried oxide (BOX) and a layer 204 (compare 104) of silicon bonded on the BOX, with an overlying layer 206 (compare 106) of silicide formed atop the layer 204 of silicon, and shallow trench isolation (STI, compare 107). This is conventional and is known.

Figure 2A:
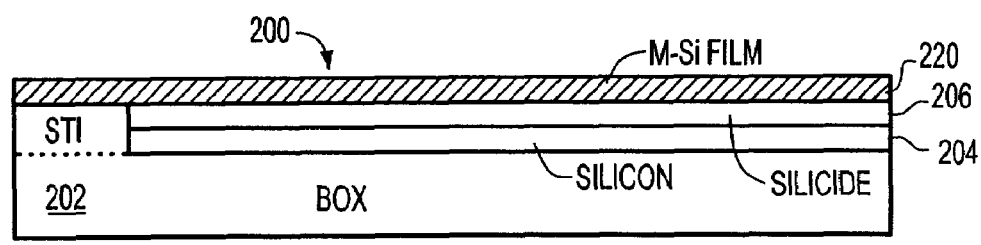
FIGS. 2A-2D are cross-sectional views illustrating an embodiment of a process for performing MC RIE, according to the invention.

In a first step of the process, a film 220 of alloyed metal silicon (M-Si) is blanket deposited (formed) on top of the silicide 206 and the STI 107 by a sputtering process (physical vapor deposition). The film 220 typically has a thickness of approximately 50-100 Angstrom, and is suitably formed by sputter deposition process. The resulting structure is shown in FIG. 2A In a next step of the process, metal in the M-Si film 220 is chemically etched away and the residual Si is oxidized, forming a SiOx on top of silicide. The resulting oxide film 222 (FIG. 2B) is a thin, protective layer, approximately 20-50 Angstroms thick.

By doing this, $SiO_2$ that is formed on top of the silicide 206 can be used as an etch stop for subsequent nitride opening. The metal Si can be $Co_xSi_y$, $Ti_xSi_y$, or $Ni_xSi_y$. Normally, the etch solution is $H_2SO_4$ with $H_2O_2$. $H_2O_2$ oxidizes both metal and Si. $H_2SO_4$ dissolves metal oxide and leaves $SiO_2$ on the surface of the silicide as in the following chemical reaction. The following is the chemical reaction sequence:

$$H_2O_2 + M \rightarrow MO_x + H_2O$$

$$H_2O_2 + Si \rightarrow SiOx + H_2O$$

$$MO_x + H_2SO_4 \rightarrow MSO_4 + H_2O$$

where M can be Ti, Ni, Co, or other transition metal.

Since the transition metals are the 38 elements in groups 3 through 12 of the periodic table whose valence electrons are present in more than one shell, they often exhibit several oxidation states.

The reason that this method works is that metal is dissolved away in the solution, while residual Si does not dissolve in the solution, but instead is oxidized by the solution. At the same time, the solution itself does not attack either the $SiO_x$ and silicide in the structure. A critical aspect of this method is that metal and Si have to be evenly intermixed in the thin film on top of the structure and the majority of the element in the film has to be metal in order for it to work. If the majority of the element in the film is Si, the reaction would be self-limiting, which means that only the top surface of the film is oxidized, forming $SiO_x$ film. The bottom part of the film would be protected by the top $SiO_x$ film from further wet etching from the solution. Thus it would create a conductive film across silicide and STI causing a metal short. If the Si concentration is too low, such as less than 5% (atomic percent), in order to grow an equivalent film thickness, it requires thicker M-Si deposition, which is not practical. Therefore, the concentration of Si in the metal-Si target is important to make the method work. Typically, in the composition of the M-Si, the Si is about 10%-30% by atomic weight, preferably about 15%-25% by atomic weight and most preferably about 20% by atomic weight.

Figure 2B:
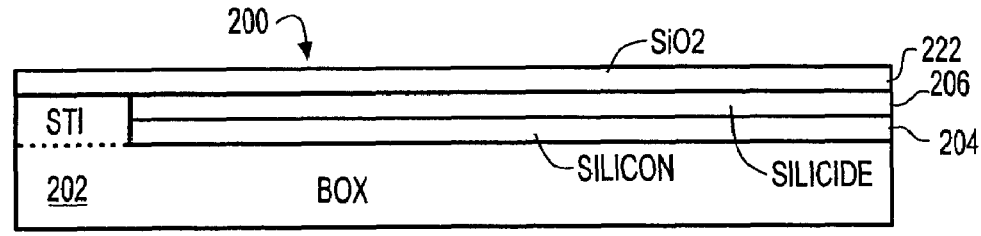

An ozone plasma treatment can be used as an option to densify the oxide 222. The resulting structure is shown in FIG. 2B.

Figure 1B:
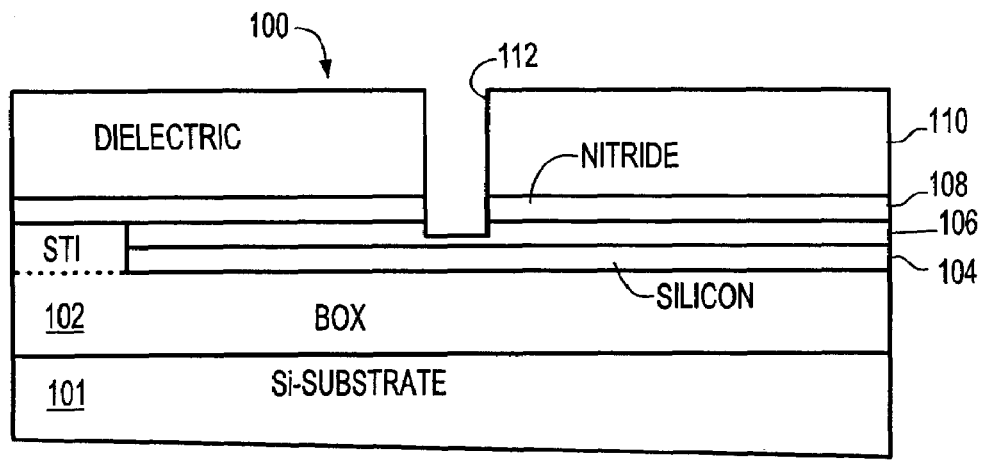
FIG. 1B is a cross-sectional view illustrating a further step in the process of the prior art.

In a next step of the process, in a manner comparable to the the steps described hereinabove with respect to FIGS. 1A and 1B; i.e., a nitride capping layer 208 (compare 108) is deposited (on top of the SiOx films); dielectric 210 (compare 110) is deposited; and MC RIE is performed (opening a hole in the dielectric and the nitride).

Figure 2C:
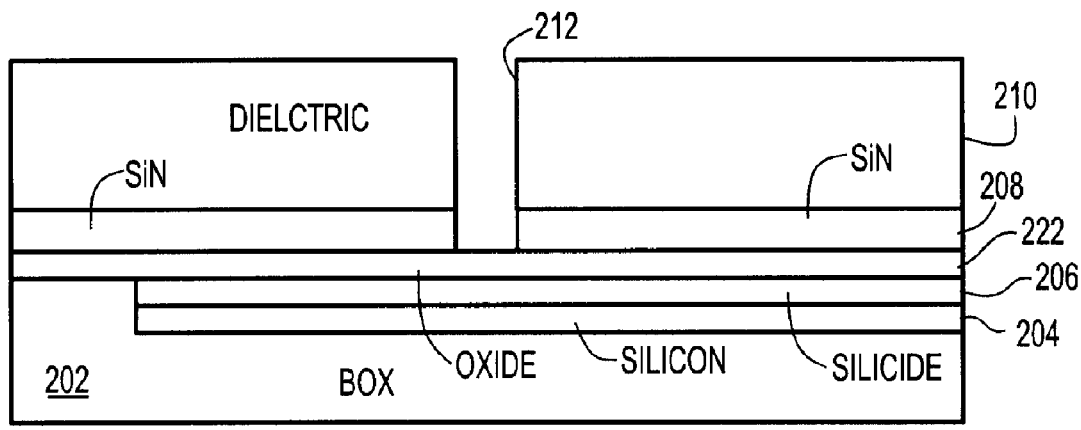

When the nitride layer 208 is opened, MC RIE stops on top of the oxide film 222. (compare contact opening 212 with opening 112). The resulting structure is shown in FIG. 2C.

The nitride layer (208), also called "barrier nitride", serves as a a diffusion barrier to protect the device from contamination (ionics from the BEOL (back end of line)).

Figure 2D:
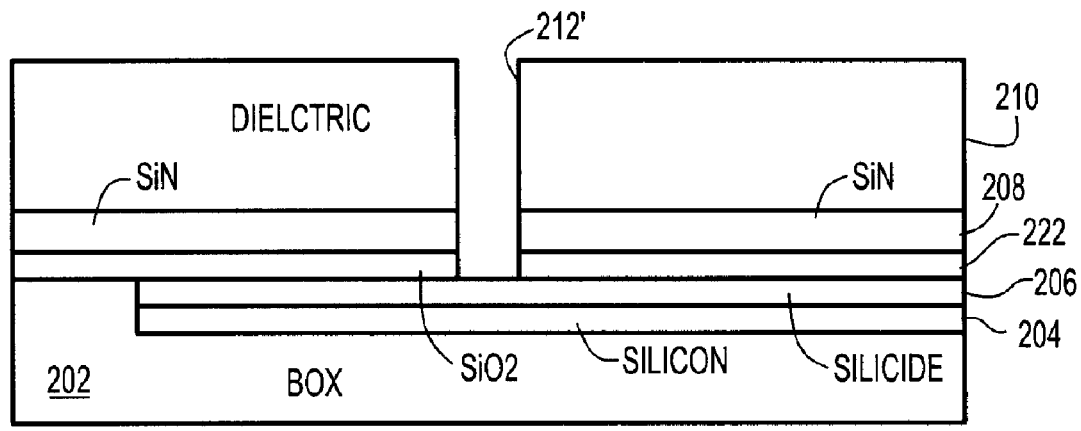

In a final step of the process, oxide RIE is performed to open the oxide 222, down to the silicide 206. The resulting structure is shown in FIG. 2D. (Contact opening is now labeled 212'.)

Alternatively, a wet etch of 500:1 DHF can be used to open $SiO_2$, and this may be preferred over the RIE open.

Hydrofluoric acid (HF) is a very hazardous acid commonly used in silicon processing to etch silicon dioxide, $SiO_2$. It is also an important component of essentially all surface cleaning recipes. Dilute HF (DHF) is dilute HF. A $SiO_2$ etching solution may comprise 49% HF in water ($H_2O$). A typical mixture would be 1 part HF: 100 parts $H_2O$.

In an exemplary application for the invention, the device is an FET (field effect transistor), and the silicide forms contact over the source (S), gate (G) and drain (D) regions of the FET.

Figure 3:
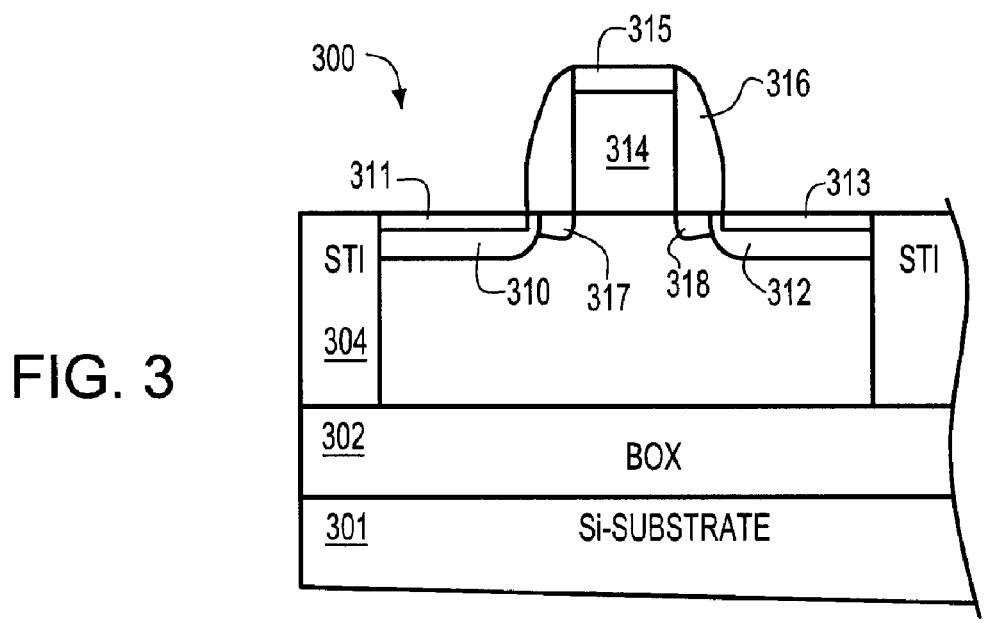
FIG. 3 is a simplified cross-sectional view of a semiconductor device which has been formed utilizing the process of the invention.

FIG. 3 is a simplified cross-sectional diagram of a FET 300 of the prior art, formed using the techniques of the present invention. The FET 300 is suitably one half of a CMOS (complementary metal oxide semiconductor) pair of FETs. The FET 300 is formed in a silicon layer 304 (compare 204) on a layer of BOX 302 (compare 202) on a silicon substrate 301 (compare 101), and, as is known, generally comprises:
 a first source (or drain) junction 310;
 a second drain (or source) junction 312;
 a first extension implant 317;
 a first extension implant 318;
 a gate electrode 314 between the source and drain junctions;
 sidewall spacers 316 on both sides of the gate structure;
 silicide 311, 313, 315 atop the source and drain junctions and the gate electrode, respectively; and
 shallow trench isolation (STI) on both sides of the FET.

Oxide and nitride (omitted, for illustrative clarity) are formed as described hereinabove. Overlying silicon dioxide is formed and MC etched, as described hereinabove (omitted, for illustrative clarity).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor device having a layer of silicide and a contact opening extending through an overlying dielectric layer to the layer of silicide, the method comprising the steps of:
 before etching the contact opening, forming an oxide film over the layer of silicide; and
 after etching the contact opening, etching the oxide film to expose the underlying layer of silicide; and wherein the step of forming the oxide film comprises:
 first forming a film of alloyed metal-silicon (M-Si) on top of the layer of silicide; and
 then forming the oxide film by wet etching the metal-silicon to remove the metal and to oxidize the residual Si to form a layer of SiOx on top of the silicide.

2. The method of claim 1, wherein the step of etching the oxide film comprises:
 performing oxide reactive ion etching (RIE).

3. The method of claim 1, wherein the step of etching the oxide film comprises:
 using 500:1 DHF.

4. The method of claim 1, further comprising the step of:
 before applying the dielectric layer, depositing a nitride capping layer.

5. The method of claim 1, wherein:
 the metal in the alloyed metal-silicon (M-Si) is selected from the group consisting of where M can be Ti, Ni, Co, or other transition metal.

6. The method of claim 1, wherein:
 the wet etching comprises an etch solution of $H_2SO_4$ with $H_2O_2$.

7. The method of claim 1, further comprising the step of:
 performing an ozone plasma treatment to densify the oxide.

8. The method of claim 1, wherein the device is a field effect transistor (FET), and the silicide comprises source and drain regions of the FET.

9. A method of protecting silicide during MC RIE etch comprising:
 before performing MC RIE etch, forming an oxide film over the silicide; and wherein the step of forming the oxide film comprises:

first forming a film of alloyed metal-silicon (M-Si) on the layer of silicide; and then, forming the oxide film by wet etching the metal-silicon to remove the metal M and to oxidize the residual Si to form a layer of SiOx on top of the silicide; and forming a nitride layer over the oxide film.

10. The method of claim 9, further comprising:

performing an ozone plasma treatment to densify the oxide.

11. The method of claim 9, further comprising:

after performing MC RIE etch, etching the oxide film.

12. The method of claim 11, wherein the step of etching the oxide film comprises:

performing oxide reactive ion etching (RIE).

13. The method of claim 11, wherein the step of etching the oxide film comprises:

a wet etch using 500:1 DHF.

* * * * *